United States Patent [19]

Andersson et al.

[11] Patent Number: 4,556,269
[45] Date of Patent: Dec. 3, 1985

[54] HOLDER FOR ELECTRONIC COMPONENTS

[75] Inventors: Folke O. A. Andersson, Tyresö; Hakan A. Larsson, Märsta, both of Sweden

[73] Assignee: Telefonaktiebolaget LM Ericsson, Stockholm, Sweden

[21] Appl. No.: 564,070

[22] Filed: Dec. 21, 1983

[30] Foreign Application Priority Data

Dec. 29, 1982 [SE] Sweden .............................. 8207492

[51] Int. Cl.⁴ .......................................... H01R 13/631
[52] U.S. Cl. ............................ 339/75 M; 339/75 MP
[58] Field of Search ............ 339/17 CF, 75 M, 75 R, 339/75 MP, 176 M, 176 MP; 324/158 F

[56] References Cited

U.S. PATENT DOCUMENTS

| 3,753,211 | 8/1973 | Pauza et al. ................... 339/17 CF |
| 4,012,097 | 3/1977 | Long et al. ..................... 324/158 F |
| 4,116,518 | 9/1978 | Pleskac .......................... 339/17 CF |

FOREIGN PATENT DOCUMENTS

| 1934752 | 1/1971 | Fed. Rep. of Germany ........ 339/75 MP |
| 2046729 | 3/1972 | Fed. Rep. of Germany ........ 339/75 MP |

Primary Examiner—John McQuade
Attorney, Agent, or Firm—Roberts, Spiecens & Cohen

[57] ABSTRACT

A holder for connecting electrical conductors to contact surfaces on electrical components comprising gripping elements for grasping a component in the holder are intended to grip the component with their gripping surfaces by being pivoted from a rest position to an engagement position. Electrical contact pins can be moved into engagement against the contact surfaces on the component by actuators. An operating mechanism provided with cams can execute a turning movement, for pivoting the gripping elements such that their gripping surfaces approach the component and also for displacing the actuators such that they move the contact pins into engagement against the contact surfaces.

11 Claims, 2 Drawing Figures

HOLDER FOR ELECTRONIC COMPONENTS

FIELD OF THE INVENTION

The invention relates to a holder for connecting electrical conductors to contact surfaces on electronic components.

DESCRIPTION OF THE PRIOR ART

Modern electronic systems contain miniaturized components to a large extent. These are electrically connected to printed circuit boards by contact surfaces on the component. The contact surfaces may be accessible from the outside on assembled components, whereby the function of both component and connections can be checked. However, difficulties arise in connecting measuring means for such a check, since the components are small and have many contact surfaces. The function of the components and the function of the circuit boards are checked separately before the components are connected to the circuit board. However, this check does not give any information with regard to the reliability of the connections or the mutual coaction of the components on the circuit board in a ready-assembled condition. Particular difficulties in connecting measuring means occur if the connections between the circuit board and component cannot be reached directly from above, especially if the connections are on all four sides of the component.

SUMMARY OF THE INVENTION

The above-mentioned problem is solved, in accordance with the invention, by a holder which is formed such that on application to the component, it surrounds the component on all sides with both mechanical gripping means and electrical connection means, the latter being connected after the gripping means have fixed the component in its position in the holder.

BRIEF DESCRIPTION OF THE FIGURES OF THE DRAWING

An embodiment of the invention will be described below in conjunction with the appended drawing, wherein.

DETAILED DESCRIPTION OF A PREFERRED EMBODIMENT

Figure 1:
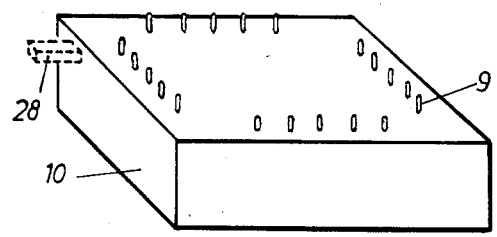
FIG. 1 illustrates the apparatus in accordance with the invention in perspective, with the individual parts spaced from each other.
Figure 1:
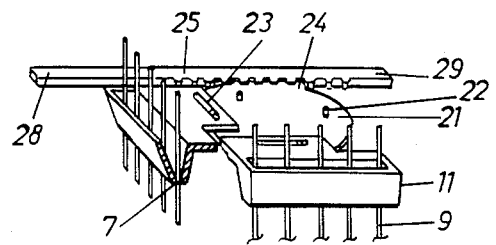
Figure 1:
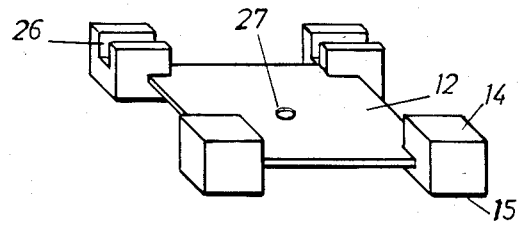
Figure 1:
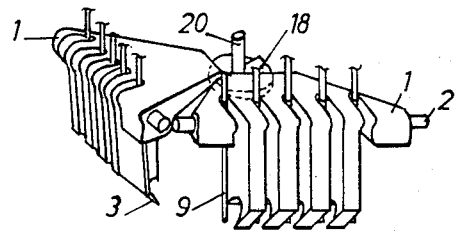
Figure 1:
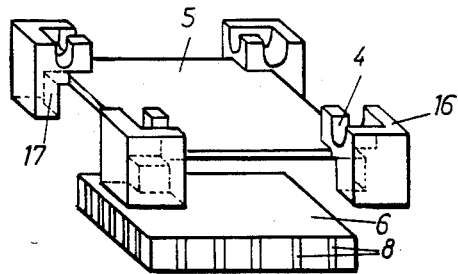

In FIG. 1 there are illustrated bell crank-shaped gripping elements 1, which are pivotable about shafts 2 and have lower arms which are provided with gripping surfaces 3. Two of the gripping elements are illustrated, there being four such elements in opposing pairs. The shafts 2 rest in journalling recesses 4 on a base 5. With their gripping surfaces, the gripping elements can grip a component 6, the gripping surfaces 3 bearing against the side surfaces of the component between electrically conductive contact surfaces 8. Electrical conductors can be connected to the component at the contact surfaces by resilient contact pins 9. At their upper ends the pins 9 are rigidly fastened in a casing 10, and extend through it to constitute electrical connections. Within the casing, the contact pins extend through holes 7 in actuators 11, so that they are flexibly guided and can be moved to a position of engagement with the contact surfaces 8. The actuators can glide against the inner bottom surface of the casing. A spacer means 12 is placed in the casing under the actuators and its upper surfaces 14 rests against the inner bottom surface of the casing. The lower surfaces 15 of the spacer means rest against surfaces 16 on the base 5, thereby keeping the shafts 2 in their positions in the journalling recesses 4. The base has recesses 17 for locating the four corners of the component 6, which can thus be placed in a given position in the holder.

The four gripping elements can be turned about their respective shafts 2 by a cam means 18 fixed to a turnable shaft 20. The shaft 20 passes through a hole 27 in the spacer means 12. At its other end, the shaft 20 carries a disc 21 provided with four pins 22, running in slots 23 in the actuators. Along a portion of its periphery the disc 21 is provided with teeth 24 in mesh with a rack 25. The rack rests in recesses 26 formed in the spacer means 12. Both end portions 28 and 29 of the rack project out through two holes in the casing 10.

The gripping elements 1 and contact pins 9 are operated in the following manner. By applying pressure in an axial direction at the ends of the rack, it can be moved backwards and forwards. This movement is translated via the teeth 24 to the disc 21, which is thus turned. The turning movement is translated imparted to the cam 18 via the shaft 20. As the shaft is turned the cam is moved in under end portions of the upper arms of the bell crank-shaped gripping elements and lifts them. The gripping elements then pivot about their shafts 2 and the gripping surfaces 3 are moved towards the component 6 for gripping it. After a given amount of turn of the cam, it no longer lifts the end portion of the gripping elements, even if turning of the shaft 20 continues. As the shaft 20 turns, the pins 22 move in their respective slots 23 in the actuators 11. The slots have a position in relation to the shaft 20 such that the radial movement of the actuators will be very small during the first part of the turn of the shaft 20. On continued turning of the shaft, when the gripping elments remain in engagement with the component, the actuators are displaced towards the center of shaft 20. The contact pins 9 are thus moved into engagement against the contact surfaces 8 of the component. The apparatus will remain in this state due to friction, in spite of the spring bias in the contact pins, even if the exterior forces are released at the ends of the rack.

The gripping elements can be provided with returning means, e.g. a further cam means, which pivot the bell crank-shaped elements so that their gripping surfaces move away from the component when the rack 25 is reset.

Figure 2:
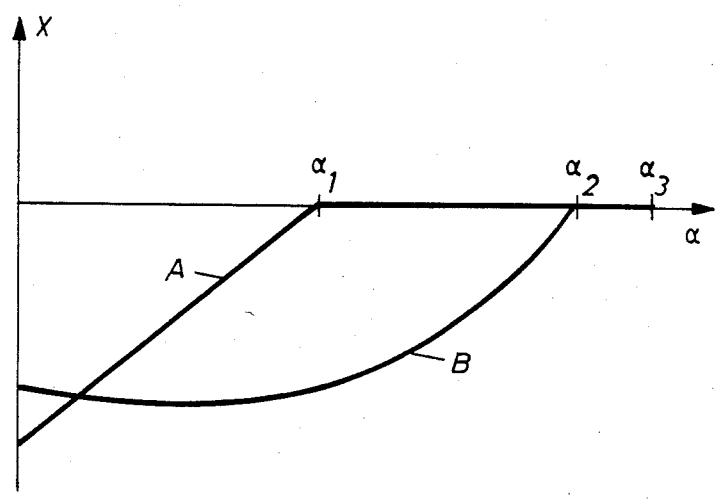
FIG. 2 is a diagram illustrating the positional alterations of the gripping means and contact springs as a function of the turning angle of the operating means.

FIG. 2 is a diagram illustrating the movement x of the gripping elements and contact pins as a function of the turning angle $\alpha$ of the shaft. As shown by line A, there is a linear change in the distance between the gripping surfaces of the gripping elements and the component during the first part. For the angle $\alpha_1$ the gripping elements have come into engagement against the side surfaces of the component. The relative positions of the pins 22 and slots 23 are selected such that during this first part of the turning movement there is only a relatively small change in the radial movement of the contact pins, which is shown by the line B. When the cam has passed the turning angle $\alpha_1$, and the gripping elements do not move, the radial distance of the actuators from the shaft decreases until the contact pins come into engagement with the contact surfaces of the component at the turning angle $\alpha_2$. The cam is then turned to its end position at the angle $\alpha_3$.

It is of course possible for operation of the contact pins also to take place with bell crank-shaped arms in the same way as for the gripping elements, in which case the cam must be adapted in a corresponding manner.

It is also conceivable that the contact pins come into contact with the component simultaneously with the gripping elements or before them. The solution according to the described embodiment gives the most secure electrical contact function, however, and requires small operating forces.

The operation of the gripping elements and contact pins may also take place using pneumatic means which replace the cam means. Such a construction should be obvious to one skilled in the art, and a more detailed description is therefore not necessary.

What is claimed is:

1. A holder for connecting electrical contact pins to spaced contact surfaces on side surfaces of an electric component on a circuit board, said holder comprising a casing, gripping means having gripping surfaces for gripping the side surfaces of the electronic component between the electrical contact surfaces thereon, said gripping means being movable from an inoperative rest position to an operative engagement position in which said gripping surfaces come into contact with said side surfaces of the electronic component, electrical contact pins supported by said casing in normally spaced relation with said contact surfaces of said component, actuator means engaging said pins for bringing said pins into operative electrical contact with said contact surfaces of the electronic component, and operating means for moving said gripping means to its operative position and for moving said actuator means and thereby said pins into contact with said contact surfaces of the electronic component, said operating means including first and second rotatable elements one for operating said actuator means, the other for operating said gripping means.

2. A holder as claimed in claim 1 wherein said other rotatable element includes a cam for moving said gripping means.

3. A holder as claimed in claim 2 wherein said gripping means is pivotable and said cam acts on said gripping means to pivot the same to said operative position.

4. A holder as claimed in claim 3 wherein said first and second rotatable elements are coupled together for common rotation.

5. A holder as claimed in claim 4 wherein said gripping means comprises pivotal gripping elements in the form of bell crank-shaped elements.

6. A holder as claimed in claim 3 comprising a displaceable element extending outside said casing and engaging one of said rotatable elements for rotating the same.

7. A holder as claimed in claim 6 wherein said displaceable element comprises a rack.

8. A holder as claimed in claim 4 wherein said electrical contact pins are fixed to said casing and are flexible so as to be bent into contact with said contact surfaces of said electronic component upon rotation of said one rotatable element.

9. A holder as claimed in claim 8 wherein said one rotatable element includes actuator pins radially spaced from the axis of rotation of the first and second rotatable elements, said actuator means having slots receiving said actuator pins for displacing said actuator means and said electrical contact pins therewith as said one rotatable element undergoes rotation.

10. A holder as claimed in claim 5 wherein said bell crank-shaped elements include first and second arms, the first arms being in engagement with said cam to produce pivotal movement of said bell crank-shaped elements as said cam rotates, said second arms being provided with said gripping surfaces.

11. A holder as claimed in claim 5 wherein the rotation of said rotatable elements produces sequential movement of said gripping means and said electrical contact pins.

* * * * *